(12) United States Patent
Wang et al.

(10) Patent No.: US 6,303,994 B1
(45) Date of Patent: Oct. 16, 2001

(54) METHOD AND APPARATUS FOR REDUCING THE FIRST WAFER EFFECT

(75) Inventors: Hougong Wang, Cupertino; Gongda Yao, Fremont, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/592,803

(22) Filed: Jun. 13, 2000

Related U.S. Application Data

(62) Division of application No. 08/794,033, filed on Feb. 3, 1997.

(51) Int. Cl.$^7$ ............................ H01L 23/48; H01L 23/52; H01L 29/40
(52) U.S. Cl. .................. 257/750; 257/771; 257/765; 257/764; 438/656; 438/652
(58) Field of Search ...................... 257/750, 765, 257/763, 764, 771; 438/656, 652, 685, 688

(56) References Cited

U.S. PATENT DOCUMENTS

| | | |
|---|---|---|
| 4,994,162 | 2/1991 | Armstrong et al. . |
| 5,358,616 | 10/1994 | Ward . |
| 5,527,438 | 6/1996 | Tedman . |
| 5,738,917 * | 4/1998 | Beser et al. . |
| 5,948,283 * | 9/1999 | Grosshart . |
| 6,159,297 * | 12/2000 | Herchen et al. . |
| 6,176,978 * | 1/2001 | Ngan . |
| 6,235,656 * | 5/2001 | Clarke . |

FOREIGN PATENT DOCUMENTS 0 869 543 * 10/1998 (EP) .
WO 96/26537 * 8/1996 (WO) .

* cited by examiner

*Primary Examiner*—Sheila V. Clark
(74) *Attorney, Agent, or Firm*—Valerie G. Dugan

(57) ABSTRACT

A method and apparatus are provided for reducing and eliminating the First Wafer Effect. Specifically, in a method, or system that employs a separate hot chamber for hot deposition of material that may result in the First Wafer Effect (FWE material), a cold layer of the FWE material is deposited within the hot deposition chamber prior to deposition of the hot FWE material layer.

19 Claims, 3 Drawing Sheets

METHOD AND APPARATUS FOR REDUCING THE FIRST WAFER EFFECT

This application is a divisional of U.S. patent application Ser. No. 08/794,033, filed Feb. 3, 1997.

This invention relates to thin film deposition and more specifically to a method and apparatus for maintaining consistently high quality deposited films regardless of chamber idle time.

BACKGROUND

Thin film deposition is essential to the manufacture of solid state electronic devices. By layering various a materials on a wafer in a prescribed pattern ("patterning"), a solid state electronic device is formed. Within the semiconductor device industry there is an ever present trend for more complex multi-layer structures and smaller device dimensions. As a result, patterned wafer costs continue to rise, with some patterned wafers costing as much as $100,000. Because a single poor quality layer can destroy the entire wafer, consistent deposition of high quality material layers is essential.

Commercial scale semiconductor device fabrication takes place within automated systems having multiple chambers. Frequently these chambers idle either between shifts, during changeover from one process configuration to the next, or during equipment repair. During equipment repair not only does the malfunctioning chamber idle, but also upstream and downstream chambers in perfect operating condition idle. Unfortunately many of the deposition materials used in semiconductor device fabrication easily oxidize if they are in the chamber during these idle periods, even at the low oxygen levels present in most high vacuum deposition chambers. When a hot deposition chamber (i.e., a chamber equipped with a heating pedestal for heating a wafer to about 300° C. to 600° C.) idles for as brief a duration as 20 to 30 minutes, the material layers ("films") deposited on the first few wafers following the idle period undesirably exhibit lower reflectance (a manifestation of broad distribution in crystal orientation that can result in early electro-migration failure and/or lithographic patterning difficulty) than do films deposited during normal production (i.e., those periods not following an idle period) and/or exhibit sheet resistance values different from those exhibited by films deposited during normal production. This phenomenon is known as the First Wafer Effect. Thus, following an idle period (i.e., a period sufficient to give rise to the First Wafer Effect) film quality and process reliability deteriorate. Therefore wafers deposited with films that exhibit the First Wafer Effect must be discarded.

Although only certain materials deposited in a hot deposition chamber may result in the First Wafer Effect, the First Wafer Effect poses a costly problem. For example, sputtered aluminum (the most widely used material for forming thin film interconnects in solid state devices) and aluminum alloys readily result in wafers exhibiting the First Wafer Effect.

The problem presented by the First Wafer Effect will be more fully comprehended with reference to the primary aluminum deposition methods employed in VLSI and ULSI circuits. As discussed previously, a constant in the semiconductor device field is the drive for reduced lateral dimensions. In order to reduce the lateral device area of storage capacitors, for example, high aspect ratio (i.e., high depth to width ratio) features (e.g., steps, trenches and vias) have become prevalent. Such features possess large side wall surface areas which allow lateral device dimensions to shrink while maintaining constant capacitor area (and thus a constant capacitance). When depositing a film over a high aspect ratio feature, material tends to deposit near the top surface (i.e. the surface nearest the deposition material source or target) of the feature and to prevent subsequently deposited material from reaching the feature's lower surface causing variations in deposition layer thickness including voids (areas containing no deposition material). Accordingly, in the deposition of thin films, much attention has been directed to formation of continuous conformal layers within high aspect ratio features.

As described in "Aluminum Planarization for Advanced Via Applications," *European Semiconductor*, February 1996, the preferred technique for achieving conformal aluminum coatings (aluminum planarization) is the sequential deposition of aluminum at low wafer temperatures (cold deposition) followed by the deposition of aluminum at high wafer temperatures (hot deposition). This process is commonly referred to as Cold/Hot Sequential Deposition and may take place in either one or two process chambers.

The layer deposited at low wafer temperatures (cold deposited) is referred to as a seed layer. The seed layer enhances the ability of material deposited at higher wafer temperatures (hot deposited) to flow into surface features. Accordingly, the seed layer must achieve continuous, conformal coverage of surface features in order to prevent thickness variations and void formations during subsequent hot deposition. To achieve continuous conformal coverage of high aspect ratio surface features a collimator or particle screening device such as the collimator described in U.S. Pat. No. 5,527,438 is employed. The particle screening device may be applied to a "long throw deposition chamber" wherein a sufficient distance exists between the source of deposition material ("the source") and the wafer mounting mechanism (or pedestal) so that only particles traveling substantially normal to the wafers top surface reach the wafer; thus resulting in more continuous conformal films as compared to films deposited in standard throw deposition chambers (i.e., chambers that are not configured for long throw deposition). A particle screening device may be placed between the source and the pedestal in order to further enhance continuous conformal coverage. Although long throw deposition results in enhanced coverage, the long throw distance results in a slower deposition rate and therefore reduces system throughput. Thus, the most advantageous configuration for Cold/Hot Sequential Deposition employs two deposition chambers, a first long throw deposition chamber for cold deposition of the seed layer, and a second standard throw deposition chamber for the hot deposition. The first chamber is configured for long throw deposition to facilitate continuous conformal coverage of high aspect ratio surface features. The second chamber is configured for standard throw deposition to facilitate reduction in process time and thus to increase throughput as compared to long throw deposition chambers.

The quality of the deposited film is further enhanced when deposited on a titanium (or titanium alloy) wetting layer. Specifically "Aluminum Planarization for Advanced Via Applications," *European Semiconductor*, February 1996, teaches that titanium layers deposited at wafer temperatures below 100° C. exhibit a strong (002) crystal orientation and that aluminum films deposited at a 460° C. wafer temperature on (002) titanium films have a strong (111) crystal orientation. The (111) orientation is associated with the strongest aluminum film electro-migration resistance characteristics and is therefore preferred.

A more detailed description of the Cold/Hot Sequential Deposition is provided in U.S. Pat. No. 4,994,162 ("the '162 Patent"). The '162 Patent acknowledges the enigma the First Wafer Effect presents, stating "[t]he deposition is optimally continuous and uninterrupted throughout all three steps, in order to prevent the formation of unwanted oxide layers that would otherwise occur during discontinuities in the process." These unwanted oxide layers are believed to cause the First Wafer Effect.

Despite wide recognition of the First Wafer Effect within the semiconductor community, a solution consistent with the high productivity requirements of commercial fabrication systems does not exist. In fact, prior to the present invention the only method for dealing with the First Wafer Effect has been to run a number of non-patterned "dummy wafers" (often as many as fifteen) through a hot deposition chamber which has idled. Not only does this reduce the productivity of the system and increase wafer costs, it also fails to address the substantial cost associated with the destruction of patterned wafers which idle within deposition chambers. Thus, a recognized need exists within the semiconductor fabrication field for a process that will eliminate the First Wafer Effect. Such a process must be cost effective and must be able to be quickly performed using existing equipment and materials.

Accordingly, it is an object of the present invention to provide a method and apparatus that eliminates the First Wafer Effect and that allows patterned wafers which idle within a fabrication system to be salvaged.

It is a further object of the invention to reduce the number of wafers that must be discarded due to the First Wafer Effect, and thus to reduce the average cost per wafer.

SUMMARY OF THE INVENTION

The present invention is directed to a process that eliminates the First Wafer Effect, to the novel device formed by the process, and to the semiconductor fabrication system that performs the inventive process. The present invention allows a partially patterned wafer which has idled within a fabrication system to be completed with little or no difference in reflectance than that exhibited by films deposited during normal production (indicating the films are of comparable quality), and allows a hot deposition chamber to begin depositing production films immediately after idle periods. Thus, the present invention achieves the advantages of increased productivity and reduced cost per wafer. Moreover, the present invention eliminates the destruction of patterned wafers caused by the First Wafer Effect.

In one aspect the present invention contemplates eliminating the First Wafer Effect ("FWE") by depositing, within a hot deposition chamber, a cold deposited film comprised of a material which may result in the FWE (a "FWE material") followed by depositing a hot deposited film of the FWE material. A further aspect of the invention contemplates deposition of a wetting layer followed by cold deposition of an FWE material within a cold chamber followed by deposition of both a cold and a hot FWE material layer within a hot deposition chamber.

A further aspect of the invention pertains to a semiconductor device fabrication system comprising a cold deposition chamber, a hot deposition chamber and a control means for causing the deposition of a first cold deposited layer within the cold deposition chamber followed by the deposition of a second cold deposited layer and a hot deposited layer within the hot deposition chamber. Preferably the first cold deposited layer is deposited on a wetting layer comprising titanium or a titanium alloy.

Another aspect of the invention pertains to the novel semiconductor device fabricated as a result of the inventive process. Specifically, because cold deposition results in small grain sizes (i.e., smaller grain size (on average) than that resulting from hot deposition) the semiconductor device fabricated as a result of the present invention will comprise a first FWE material layer having a second FWE material layer formed thereon, and a third FWE material layer formed on the second FWE material layer, wherein the second FWE material layer has a small grain size and the third FWE material layer has a large grain size (i.e., a larger grain size (on average) than that resulting from cold deposition). Further, when an idle period occurs a FWE material will oxidize during the idle period and the second FWE material layer will contain a higher oxygen concentration than that contained within the third FWE material layer.

BRIEF DESCRIPTION OF THE DRAWINGS

These and other features, aspects, and advantages of the present invention will become better understood with regard to the following description, appended claims, and accompanying drawings wherein:

FIG. 2A is a cross sectional view of a wafer after deposition within the cold deposition chamber of FIG. 1; and FIG. 2B is a cross sectional view of the wafer after deposition within the hot deposition chamber of FIG. 1.

DETAILED DESCRIPTION OF THE PREFERRED EMBODIMENTS

Figure 1:
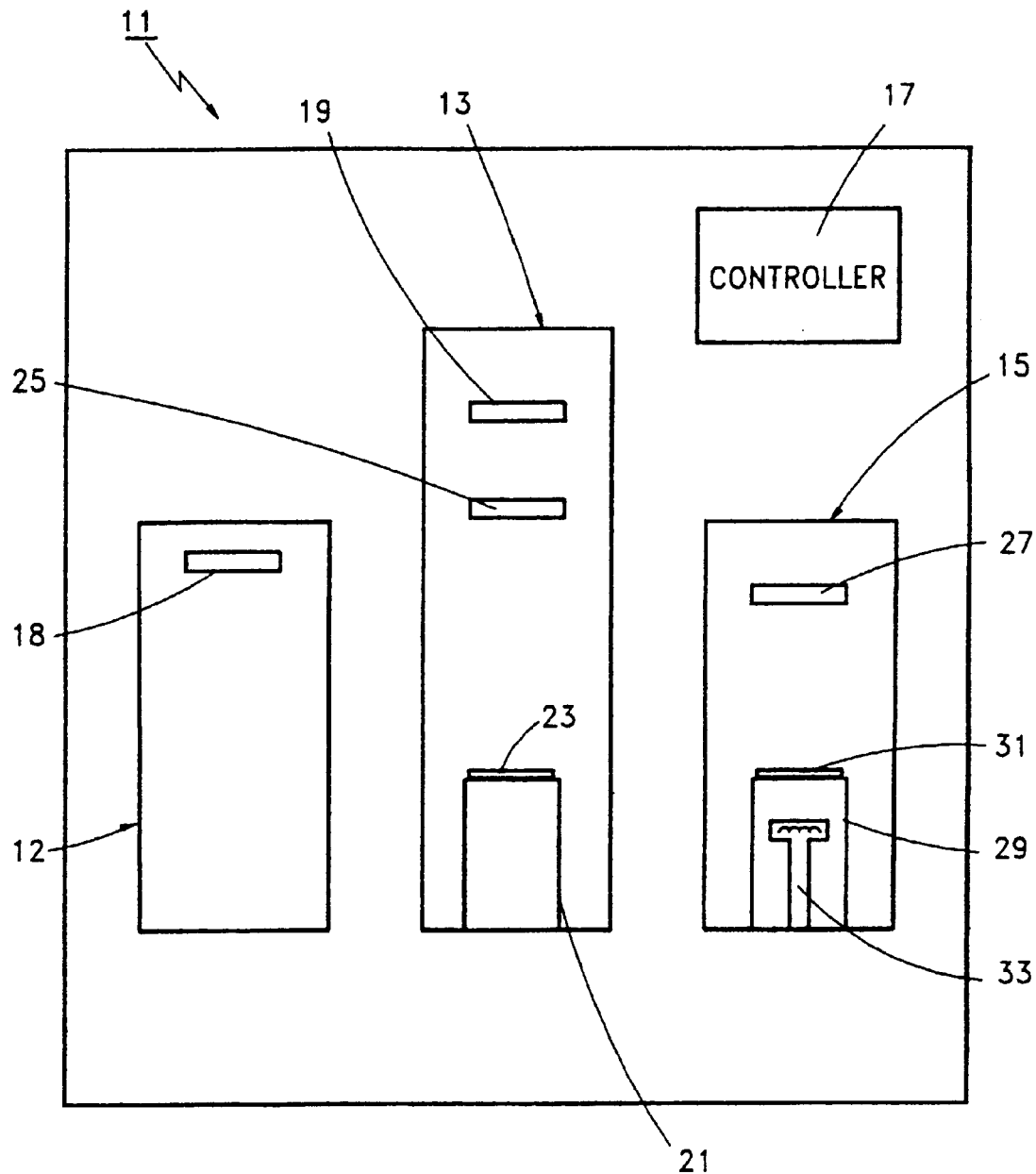
FIG. 1 is a cross sectional view in pertinent part of a semiconductor device fabrication system having a cold deposition chamber and a hot deposition chamber for performing the present invention.

FIG. 1 is a cross sectional view in pertinent part of a semiconductor device fabrication system 11 for performing the present invention. The semiconductor device fabrication system 11 comprises in pertinent part, an optional wetting layer chamber 12, a cold deposition chamber 13, a hot deposition chamber 15 and a controller 17. The optional wetting layer chamber 12 comprises a source 18 which preferably consists of titanium. In one embodiment, the cold deposition chamber 13 is a cold deposition chamber (i.e., a chamber for depositing films at wafer temperatures less than about 200° C. (cold temperatures)). In one embodiment, the cold deposition chamber 13 comprises a first source 19, a particle screening device 25, and a first pedestal 21 for holding a first wafer 23. The first pedestal 21 and the particle screening device 25 are located a long throw distance from each other (i.e. a distance equal to or greater than the diameter of the wafer on which material is to be deposited) and the particle screening device 25 is located between the first source 19 and the first pedestal 21. Cold deposition chambers and their method of operation are well known in the art. A typical cold deposition chamber that employs a particle screening device is disclosed in commonly assigned U.S. Pat. No. 5,527,438 ("the '438 Patent") the entire disclosure of which is hereby incorporated by reference. As described in the '438 Patent, through use of a particle screening device (such as a collimator plate or tube shaped collimator), even high aspect ratio surface features are coated with a conformal material layer of substantially uniform thickness. Thus, although inclusion of a particle screening device within the cold deposition chamber of the present invention is not essential, it is presently preferred.

The hot deposition chamber 15 is operatively coupled to the cold deposition chamber 13. The hot chamber 15 is for depositing films at hot wafer temperatures (i.e., wafer temperatures of about 300° C. or greater) and contains a second source 27 and a second pedestal 29 for holding a second wafer 31. The second source 27 and the second pedestal 29 are located a standard throw distance from each other (about 4–5 cm when depositing material on an eight inch (20 cm) diameter) wafer). The second pedestal 29 comprises a heating mechanism 33 for heating the second wafer 31. While the heating mechanism 33 is shown as a heater for heating the backside of the second wafer 31, it is understood by those of ordinary skill in the art that other heating mechanisms may be employed. Hot deposition chambers and their method of operation are well known in the art. A typical hot deposition chamber that employs a backside heater is disclosed in U.S. Pat. No. 4,994,162, the entire disclosure of which is hereby incorporated by reference.

During operation, a wafer will enter the optional wetting layer chamber 12 and, while at a temperature preferably less than or equal to 200° C., will be deposited with titanium from the source 18. The wafer is then transferred to the first pedestal 21 of the first deposition chamber 13, and a layer of FWE material from the first source 19 is deposited on the wafer while the wafer is maintained at a cold temperature. The wafer is then transferred to the second pedestal 29 of the second deposition chamber 15 and a layer of FWE material from the second source 27 is deposited on the wafer while the wafer is maintained at a cold temperature. For example, if the heating mechanism 33 is a backside gas heater, the pressure and temperature of the gas (if any) applied to the backside of the wafer through the heating mechanism 33 is insufficient to elevate the wafer's temperature above 200° C. while the layer of cold deposited FWE material is deposited from the second source 27. After a cold deposited layer of sufficient thickness is deposited, the deposition may cease while gas of sufficient temperature and pressure to heat the wafer to a hot temperature is applied to the backside of the wafer through the heating mechanism 33. When the wafer reaches the desired hot temperature, deposition resumes. Alternatively, deposition of the cold and hot deposited FWE material layers from the second source 27 may be continuous, i.e., may continue while the wafer is heated from the cold temperature to the hot temperature, thus reducing the overall process time.

The controller 17, which is also connected to the hot deposition chamber 15, controls the operation of at least the hot deposition chamber 15, and, in the preferred embodiment controls the operation of the entire semiconductor device fabrication system 11. The controller 17 allows an operator to control operation of the hot deposition chamber 15. Preferably the controller 17 is a programmable device which is programmed so that each wafer processed within the semiconductor device fabrication system 11 is deposited (see FIGS. 2A–2B) with a first (cold deposited) film 35 (within the cold deposition chamber 13) and is deposited with a second (cold deposited) film 37 and a third (hot deposited) film 39 (within the hot deposition chamber 15).

Thus, in the preferred embodiment each wafer that enters the semiconductor device fabrication system 11 follows the same process steps regardless of whether the wafer is processed following an idle period or is processed during normal production. Because each wafer within the semiconductor device fabrication system 11 receives identical processing, device reliability is unaffected by idle periods. Thus, the semiconductor device fabrication system 11 experiences less downtime than prior art systems, and exhibits substantially lower scrap wafer costs than do prior art fabrication systems. Further, the semiconductor device fabrication system 11 is more automated and requires fewer man hours than do prior art fabrication systems and operates the same regardless of idle periods. The present invention increases system productivity and reduces the cost per unit processed.

Figure 2A:
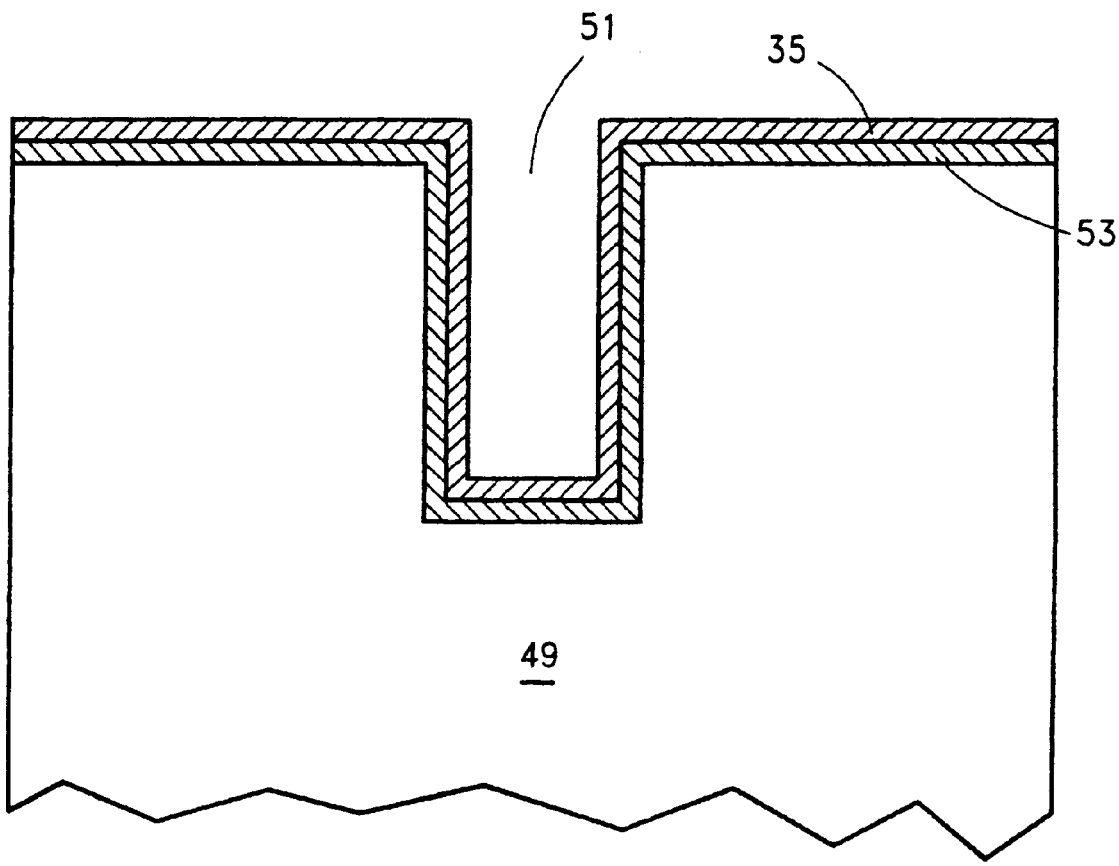
FIGS. 2A–2B show a wafer as it progresses through the semiconductor device fabrication system of FIG. 1 and is processed in accordance with the present invention.
Figure 2B:
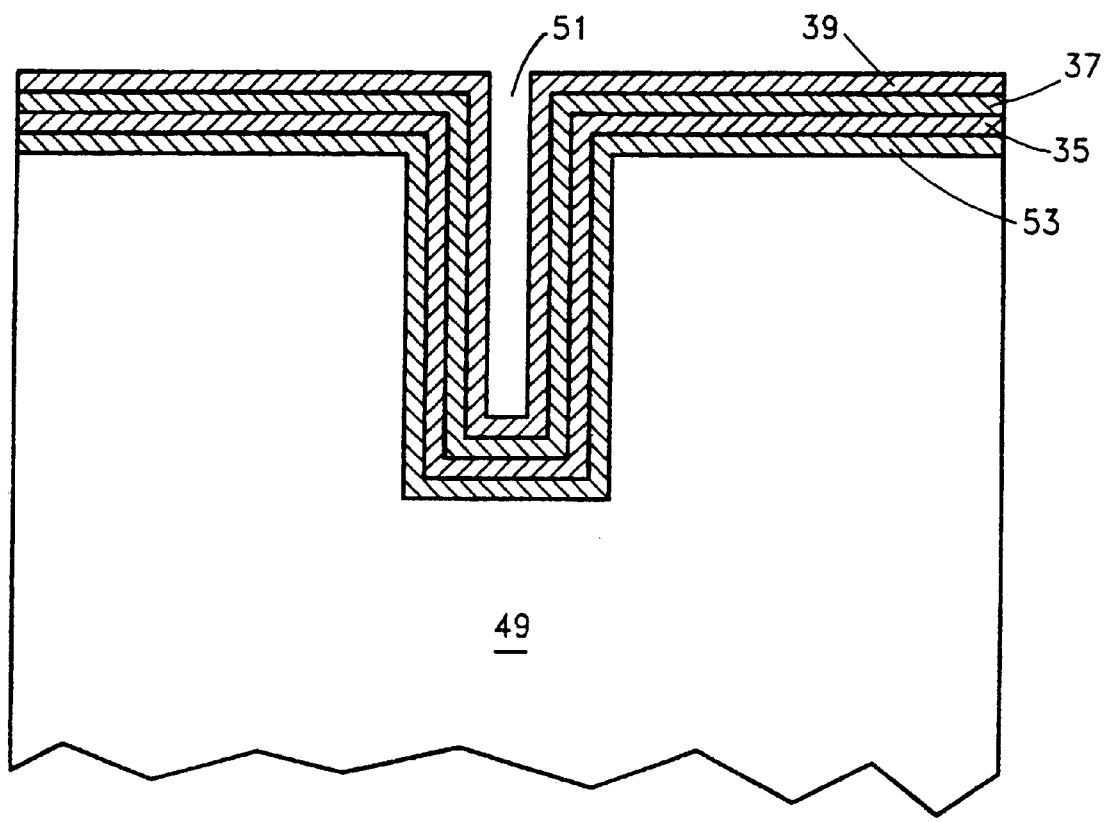

FIGS. 2A–2B show a wafer 49 having a high aspect ratio surface feature 51 as it progresses through the semiconductor device fabrication system 11 and is processed in accordance with the present invention. FIG. 2A is a cross sectional view of a wafer 49 after deposition of the first (cold deposited) film 35 within the cold deposition chamber 13. As shown, within the cold deposition chamber 13 the first (cold deposited) film 35 is preferably deposited on a wetting layer 53. In the preferred embodiment the first (cold deposited) film 35 comprises aluminum and the wetting layer 53 comprise titanium exhibiting strong (002) crystal orientation. Therefore, as previously described, the (111) crystal orientation of the first (cold deposited) film 35 is enhanced. Deposition of the titanium wetting layer 53 at a wafer temperature in the range of 200° C. and below, is believed to produce a titanium wetting layer 53 having a strong (002) crystal orientation. Because the first (cold deposited) film 35 is deposited at a cold wafer temperature it has a small grain size (not shown).

FIG. 2B is a cross sectional view of the wafer 49 after deposition within the hot deposition chamber 15. Within the hot deposition chamber 15 the second (cold deposited) film 37 is deposited from the second source 27 over the first (cold deposited) film 35. Second (cold deposited) film 35 has a first oxygen concentration (not shown). Preferably the second (cold deposited) film 37 is deposited at a wafer temperature in the range of 200° C. and below, and is most preferably deposited at a wafer temperature in the range of 100° C. and below.

Because the second (cold deposited) film 37 is deposited at cold wafer temperatures it has a small grain size (not shown). Following deposition of the second (cold deposited) film 37, the third (hot deposited) film 39 is deposited from the second source 27. The third (hot deposited) film 39 has a second oxygen concentration (not shown). Preferably the third (hot deposited) film 39 is deposited at a wafer temperature in the range of 300° C. to 600° C., and is most preferably deposited at a wafer temperature in the range of 400° C. to 550° C. Because the third (hot deposited) film 39 is deposited at hot wafer temperatures it has a large grain size (not shown).

It is understood that the second (cold deposited) film 37 and the third (hot deposited) film 39 are consecutively deposited (that is, a period sufficient to cause the First Wafer Effect does not occur between deposition of the second (cold deposited) film 37 and deposition of the third (hot deposited) film 39). Further, the first (cold deposited) film 37 is deposited from a first source of a FWE material (e.g., the first source 19 of FIG. 1), and the second (cold deposited) film 37 and the third (hot deposited) film 39 are deposited from a common, second source of the FWE material (e.g., the second source 27 of FIG. 1). In the preferred embodiment the first (cold deposited) film 35, the second (cold deposited) film 37 and the third (hot deposited) film 39 each comprise the same FWE material, preferably aluminum or aluminum alloys.

The thickness of the second (cold deposited) film 37 required in order to reduce or eliminate the First Wafer Effect will depend on the surface passivation characteristics of the FWE material being deposited. An aluminum source, for example, typically is passivated by oxygen to a surface depth of 100 A. In order to remove 100 A from the source, a film thickness of approximately 50 A should be deposited. For a specific application the thickness required of the second (cold deposited) film 37 will be easily determined by those of ordinary skill in the art. If the second (cold deposited) film 37 is deposited following an idle period the second (cold deposited) film 37 will exhibit a higher oxygen concentration than would a film deposited during normal production. Thus, when deposited following an idle period, the oxygen concentration of the second (cold deposited) film 37 is higher than the oxygen concentration of the third (hot deposited) film 39.

Test results demonstrate that the combination of the cold deposited film 37 and the hot deposited film 39 (despite the higher levels of oxygen incorporation in the cold deposited film 37 of the first wafer) exhibits the same degree of reflectivity and crystal orientation (preferably narrowly distributed) whether deposited following an idle period or deposited during normal production. The present invention has been tested on systems that have idled as long as 12 hours—and no First Wafer Effect occurred. Accordingly semiconductor wafer fabrication systems employing the present invention will no longer need to run dummy wafers after equipment start up, will experience substantial productivity increases and will achieve reduced cost per unit processed.

The foregoing description discloses only the preferred embodiments of the invention. Modifications of the above-disclosed method and apparatus that fall within the scope of the invention will be readily apparent to those of ordinary skill in the art. For example, although the heating mechanism is depicted as a mechanism for applying hot gas to the back plane of the wafer, other mechanisms for wafer heating for example radiant heat sources or RF heat sources may be employed either alone or in combination. Further, heat may be applied to planes other than the back plane of the wafer. Alternative methods of depositing the FWE material including sputtering, thermal evaporation, electron beam evaporation and the like may be employed and the deposition material source may be located at various positions within the deposition chamber. Although the preferred fabrication system employs a programmable controller, apparatuses employing a simple switch or other manual control mechanism would fall within the scope of the invention. In short, any method or apparatus which heretofore has resulted in the First Wafer Effect, and which hereafter employs cold deposition within a hot deposition chamber in order to avoid the First Wafer Effect, is within the scope of the present invention; the present invention includes any method or apparatus which employs cold deposition within a hot deposition chamber for the purpose of reducing the First Wafer Effect. Thus, while the present invention has been disclosed in connection with the preferred embodiments thereof, it should be understood that there are other embodiments that fall within the spirit and scope of the invention, as defined by the following claims.

What is claimed is:

1. A solid state electronic device produced by:
   depositing a first film at a first wafer temperature in a first deposition chamber;
   depositing a second film at a second wafer temperature in a second deposition chamber; and
   depositing a third film at a third wafer temperature in the second deposition chamber;
   wherein the second and third films are consecutively deposited from a common source of an FWE material, the third temperature is higher than the second temperature and the first film comprises the FWE material.

2. A solid state electronic device produced by:
   depositing a first film at a first wafer temperature in a first deposition chamber;
   depositing a second film at a second wafer temperature in a second deposition chamber; and
   depositing a third film at a third wafer temperature in the second deposition chamber;
   wherein the second and third films are consecutively deposited from a common source of an FWE material, the third temperature is higher than the second temperature and the first film comprises the FWE material; and
   wherein the first, second and third wafer temperatures and a thickness of the second film are such that when an idle period occurs, a third film of a first wafer deposited following the idle period exhibits a first reflectance which is substantially equivalent to a second reflectance exhibited by a third film of a subsequent wafer deposited during normal production.

3. A semiconductor device fabrication system comprising:
   a first deposition chamber for depositing a first film at a first temperature;
   a second deposition chamber, operatively coupled to the first deposition chamber, for depositing a second film at a second temperature and for depositing a third film at a third temperature; and
   a controller, operatively coupled to at least the second deposition chamber, for causing the second deposition chamber to consecutively deposit the second film and the third film from a common source of a FWE material; wherein the first, second and third temperatures and a thickness of the second film, are such that when an idle period occurs, a third film of a first wafer deposited following the idle period exhibits a first reflectance which is substantially equal to a second reflectance exhibited by a third film of a subsequent wafer deposited during normal production.

4. The system of claim 3 wherein the first deposition chamber comprises a first source of the FWE material.

5. The system of claim 4 further comprising a wetting layer chamber operatively coupled to the first deposition chamber for depositing a wetting layer prior to deposition of the first film.

6. The system of claim 5 wherein the wetting layer chamber comprises a titanium source.

7. The system of claim 5 wherein the first deposition chamber is a long throw deposition chamber.

8. The system of claim 7 wherein the second deposition chamber is a standard throw deposition chamber.

9. The system of claim 8 wherein the first deposition chamber comprises a particle screening device.

10. The system of claim 3 wherein the first film is deposited at a first pressure, the second film is deposited at a second pressure and the third film is deposited at a third pressure.

11. The system of claim 10 wherein said first chamber and said second chamber are a single chamber.

12. The system of claim 10 wherein the first temperature, the second temperature and the third temperature are a single temperature.

13. A solid state electronic device comprising:
   a first FWE material film comprising a small grain structure;

a second FWE material film on said first FWE material film, said second FWE material film having a small grain structure and a first oxygen concentration;

a third FWE material film on said second FWE material film, said third FWE material film having a large grain structure and a second oxygen concentration; wherein the first oxygen concentration is higher than the second oxygen concentration.

14. The device of claim 13 wherein the third FWE material film comprises a crystal orientation having a narrow distribution.

15. The device of claim 14 wherein said first FWE material film comprises a FWE material, said second FWE material film comprises the FWE material and the third FWE material film comprises the FWE material.

16. The device of claim 15 wherein the FWE material layer is aluminum.

17. The device of claim 15 wherein the FWE material is an aluminum alloy.

18. The device of claim 16 further comprising a titanium wetting layer, wherein the first FWE material layer is on said wetting layer.

19. The device of claim 17 further comprising a titanium wetting layer, wherein the first FWE material layer is on said wetting layer.

* * * * *